US007378901B2

(12) United States Patent
Chung

(10) Patent No.: US 7,378,901 B2
(45) Date of Patent: May 27, 2008

(54) VARACTOR DEVICE

(75) Inventor: Yuan-Hung Chung, Jhudong Township, Hsinchu County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 197 days.

(21) Appl. No.: 11/340,636

(22) Filed: Jan. 27, 2006

(65) Prior Publication Data

US 2006/0197189 A1    Sep. 7, 2006

(30) Foreign Application Priority Data

Mar. 7, 2005    (TW) .............................. 94106768 A

(51) Int. Cl.
*H01L 29/93*    (2006.01)

(52) U.S. Cl. ...................................................... 327/586

(58) Field of Classification Search ................ 323/370; 327/337, 54, 55, 65, 67, 87, 541, 543
See application file for complete search history.

(56) References Cited

U.S. PATENT DOCUMENTS 5,875,126 A * 2/1999 Minch et al. .......... 365/185.01

OTHER PUBLICATIONS

Linsley, Trevor, Basic Electrical Installation Work, Elsevier Publishing Company, 2005 edition, ISBN 0750666242, p. 59.*

* cited by examiner

*Primary Examiner*—N. Drew Richards
*Assistant Examiner*—Daniel Rojas
(74) *Attorney, Agent, or Firm*—Bacon & Thomas, PLLC

(57)    ABSTRACT

A varactor device includes a capacitance circuit having a capacitor set and a first transistor connected across the capacitor set; a first variable resistor; and a second transistor coupled to the first transistor and connected in series to the first variable resistor for feeding an output signal generated by applying voltage to the capacitance circuit back to the first transistor, thereby controlling a gain of the first transistor by tuning the first variable resistor.

27 Claims, 3 Drawing Sheets

VARACTOR DEVICE

BACKGROUND OF THE INVENTION

1. Field of the Invention

The invention relates to a varactor and, more particularly, to a varactor device capable of successively tuning its capacitance magnitude in a large range.

2. Description of Related Art

Generally, a varactor is completed by a MOS process. As shown in FIG. 1, the MOS varactor has a capacitance tuning ratio which is lower than three and needs complicated masks in production, thus it cannot meet the practical requirement. FIG. 2 is a view of a typical diode varactor produced by a CMOS process, which has a capacitance tuning which is ratio lower than two, thus it can tune the capacitance only in a small range and cannot meet the practical requirement as well.

In addition, a digital varactor is designed, as shown in FIG. 3. The digital varactor consists of capacitors $C_F$, $C_{D0-N}$, and switch transistors $S_{0-N}$. The switch transistors $S_{0-N}$ control the respective capacitors $C_{D0-N}$ to be connected in parallel with the capacitor $C_F$ or not. Accordingly, a number of capacitors connected in parallel are changed by respectively controlling the switch transistors $S_{0-N}$ on and off. Thus, the capacitance tuning effect is obtained. In addition, the capacitance tuning ratio can relatively increase with the increased number of the capacitors $C_{D0-N}$ However, such a tuning can tune the capacitance only to a specific value rather than tuning the capacitance successively.

Therefore, it is desirable to provide an improved varactor device to mitigate and/or obviate the aforementioned problems.

SUMMARY OF THE INVENTION

An object of the invention is to provide a varactor device, which can successively tune its capacitance magnitude in a large range.

Another object of the invention is to provide a differential varactor device, which can successively tune its capacitance magnitude in a large range.

In accordance with one aspect of the invention, there is provided a varactor device including a capacitance circuit having a capacitor set and a first transistor connected across the capacitor set; a variable resistor; and a second transistor connected to the first transistor and cascaded the variable resistor for feeding an output signal generated by applying a voltage to the capacitance circuit back to the first transistor, thereby controlling a gain of the first transistor by tuning the variable resistor.

In accordance with another aspect of the invention, there is provided a differential varactor device including: a first capacitance circuit, which has a first capacitor set and a first transistor connected across the first capacitor set; a variable resistor; a second transistor, which is coupled to the first transistor and connected in series to the variable resistor for feeding an output signal generated by applying voltage to the first capacitance circuit back to the first transistor; a second capacitance circuit, which has a second capacitor set and a third transistor connected across the second capacitor set; and a fourth transistor, which is coupled to the third transistor and connected in series to the variable resistor for feeding an output signal generated by applying voltage to the second capacitance circuit back to the third transistor, thereby controlling gains of the first and the third transistors by tuning the variable resistor.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
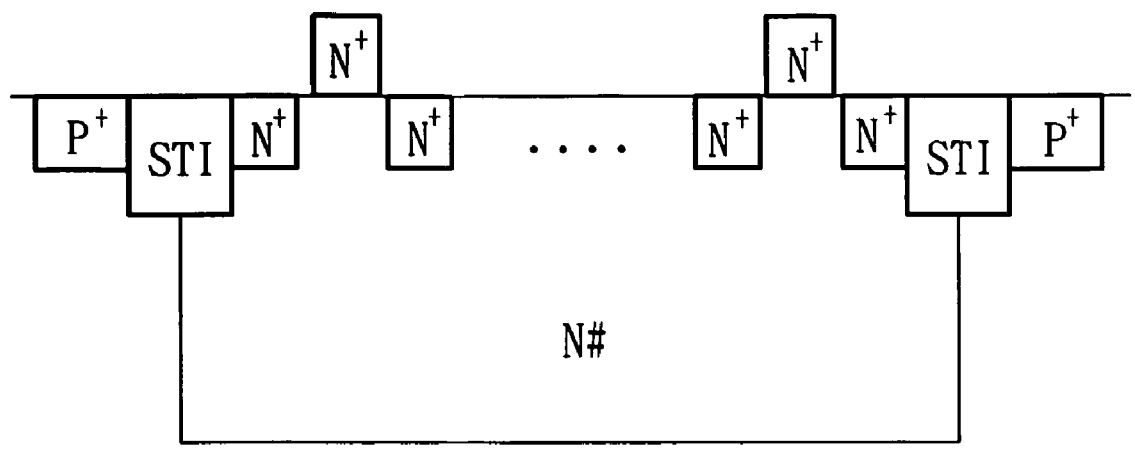
FIG. 1 is a schematic view of a typical varactor produced by a MOS process.
Figure 2:
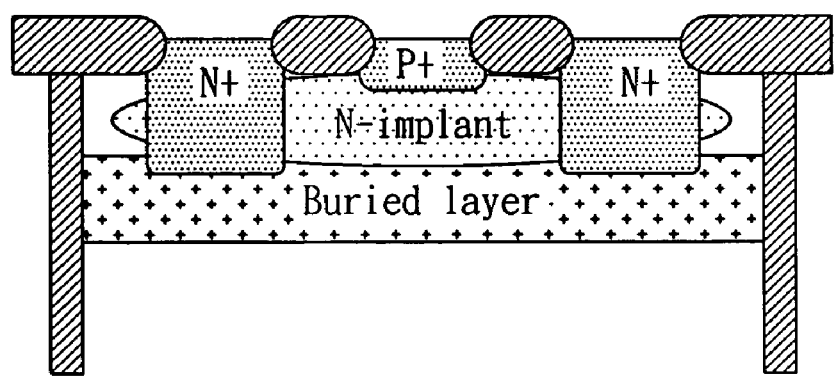
FIG. 2 is a cross-section view of a typical diode varactor produced by a CMOS process.
Figure 3:
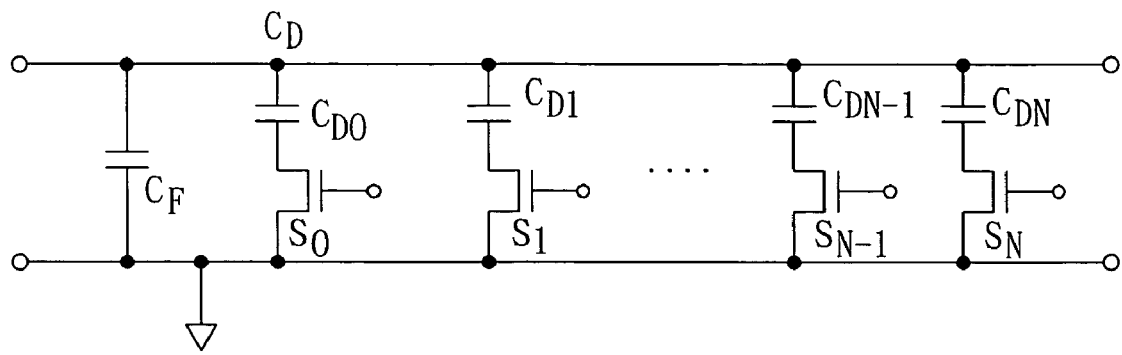
FIG. 3 is a diagram of a typical digital varactor device.
Figure 4:
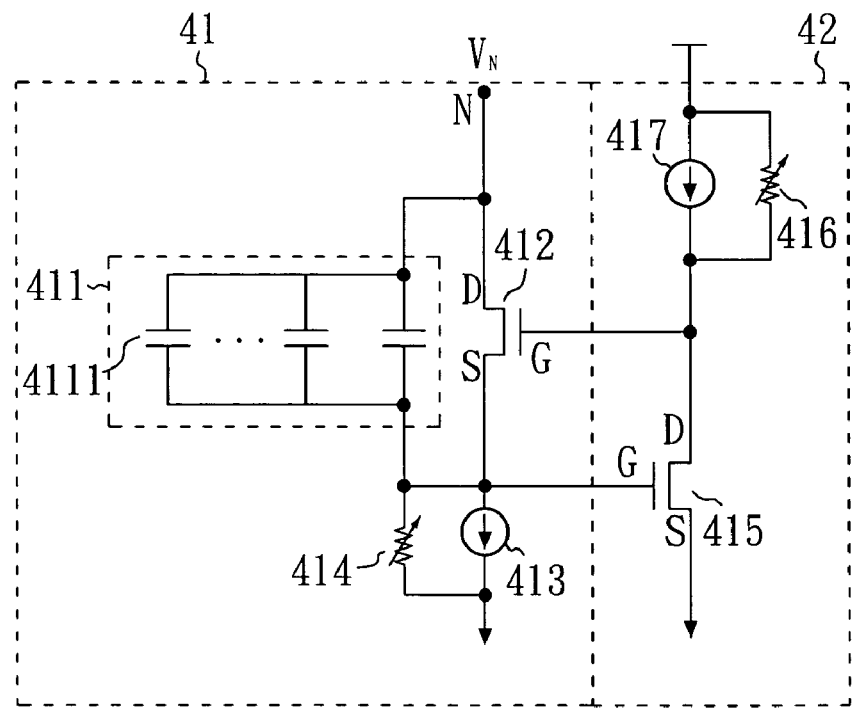
FIG. 4 is a diagram of a varactor device according to the invention.

FIG. 4 is a diagram of a varactor device in accordance with the invention. As shown 4, the varactor device includes a capacitance circuit 41 and a feedback circuit 42. The capacitance circuit 41 has a capacitor set 411 and a transistor 412, a current source 413 and a resistance device 414. The feedback circuit 42 has a transistor 415, a variable resistor 416 and a current source 417. In this embodiment, the transistors 412 and 415 are MOS transistors.

In the capacitance circuit 41, the transistor 412 has a source S and a drain D respectively connected to two ends of the capacitor set 411. The capacitor set 411 is a capacitor 4111 or a plurality of capacitors 4111 connected in parallel. The current source 413 is connected in series to the source S of the transistor 412 for providing a bias current to the transistor 412 such that the transistor 412 can operate in its working region. The resistance device 414 is connected in series to the capacitor set 411 and the transistor 412. The resistance device 414 can be a resistor or variable resistor. In this case, the resistance device 414 is a variable resistor, and preferably a voltage controlled resistor. When a voltage Vn is applied to, for example, the capacitance circuit 41, a capacitance effect is generated and an output signal is generated by the source S of the transistor 412.

In the feedback circuit 42, the variable resistor 416 is preferably a voltage controlled resistor, and the transistor 415 has a gate G connected to the source S of the transistor 412 and a drain D connected to both the variable resistor 416 and a gate G of the transistor 412. The current source 417 is connected in series to the drain D of the transistor 415 for providing the bias current to the transistor 415 such that the transistor 415 can operate in its working region. The feedback circuit 42 feeds the output signal generated by applying the voltage to the capacitance circuit 41 back to the transistor 412 for controlling a gain $g_m$ of the transistor 412 by tuning the variable resistor 416 and a gain $g_m$ of the transistor 415 by tuning the resistance device 414.

Figure 5:
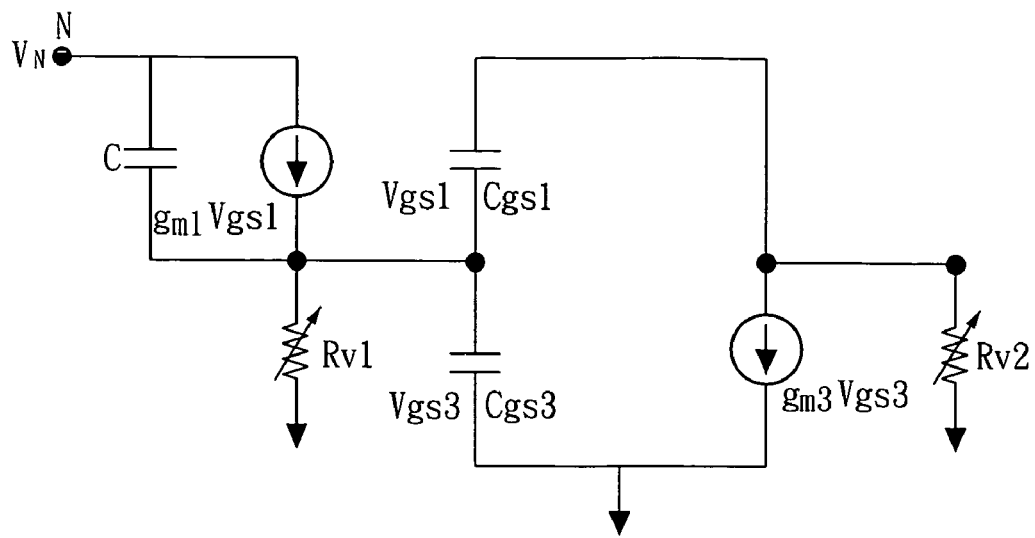
FIG. 5 is a diagram of an equivalent small signal circuit of FIG. 4 in accordance with the present invention.

To further analyze the varactor device, FIG. 5 illustrates its equivalent small signal circuit, where C represents a capacitance of the capacitor set 411, $R_{v1}$ and $R_{v2}$ respectively represent resistance of the resistance device 414 and the variable resistor 416, $g_{m1}$ and $g_{m2}$ respectively represent gains of the transistors 412 and 415, $V_{gs1}$ and $V_{gs2}$ respectively represent gate-source voltages of the transistors 412 and 415, $C_{gs1}$ and $C_{gs2}$ respectively represent gate-source equivalent capacitance of the transistors 412 and 415.

Accordingly, an equivalent resistance on a node N of the circuit can be obtained by an equation:

$$Z_{eff} = (1/j \cdot C)[1 + g_{m1}R_{v1} + g_{m1}g_{m2}R_{v1}R_{v2} + j\omega R_{v1}C].$$

When $g_{m1}g_{m2}R_{v1}R_{v2} >> \omega R_{v1}C$, $g_{m1}g_{m2}R_{v1}R_{v2} >> g_{m1}R_{v1}$ and $g_{m1}g_{m2}R_{v1}R_{v2} >> 1$, by selecting appropriate device dimensions, capacitance and resistance, the equation can be simplified as:

$$Z_{eff} = (g_{m1}g_{m2}R_{v1}R_{v2}/j\omega C_{eff})],$$

where $C_{eff}$ indicates an equivalent capacitance. Accordingly, equivalent capacitance $C_{eff} = C/g_{m1}g_{m2}R_{v1}R_{v2}$ is obtained. As such, it is known that the resistance $R_{v2}$ of the variable resistor 416 is employed to tune the gain $g_{m1}$ (as $g_{m1}R_{v2}$) while the resistance $R_{v1}$ of the resistance device 414 us employed to tune the gain $g_{m2}$ (as $g_{m2}R_{v2}$). Therefore, the capacitance can be tuned successively in a large range by tuning the resistance of the variable resistor 416 or both resistance of the variable resistor 416 and the resistance device 414. In addition, the capacitance C of the capacitor set 411 is further changed by increasing or reducing a number of capacitors 4111 connected in parallel. Thus, the tuning range of the varactor circuit is changed.

Figure 6:
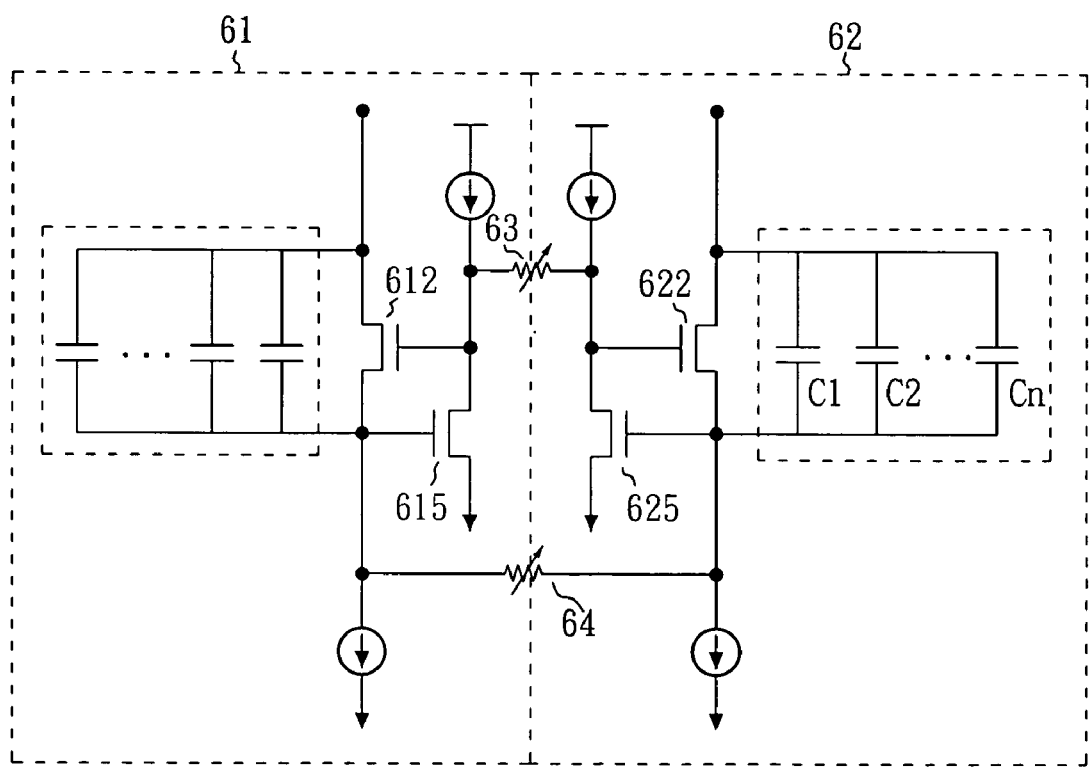
FIG. 6 is a diagram of a differential varactor device in accordance with the present invention.

FIG. 6 is a circuit diagram of another embodiment in accordance with the invention, which is a differential varactor device. The differential varactor circuit is composed of two identical varactor devices 61, 62, each having a circuit configuration the same as that of FIG. 4, except that the varactor devices 61, 62 share a variable resistor 63 and a resistance device 64. The variable resistor 63 is connected between gates of transistors 612 and 622 while the resistance device 64 is connected between gates of transistors 615 and 625. Since the circuit configurations of the varactor devices 61, 62 respectively are the same as that of FIG. 4, successively tuning capacitance and changing capacitance tuning range can also be obtained in the differential varactor device by the same reason as the previous embodiment, and thus a detailed description is deemed unnecessary.

In view of the foregoing, it is known that the invention uses the circuit technique to implement the varactor device and all circuit components of which can be made by the typical CMOS process. In addition, the invention can simply use an analog manner to control and tune the capacitance, and also greatly increase the capacitance tuning ratio by appropriately determining a number of capacitors of the capacitor set.

Although the present invention has been explained in relation to its preferred embodiment, it is to be understood that many other possible modifications and variations can be made without departing from the spirit and scope of the invention as hereinafter claimed.

What is claimed is:

1. A varactor device, comprising:
   a capacitance circuit, which has a capacitor set and a first transistor connected across the capacitor set;
   a variable resistor; and
   a second transistor, which is coupled to the first transistor and connected in series to the variable resistor, for feeding an output signal generated by applying voltage to the capacitance circuit back to the first transistor, thereby controlling a gain of the first transistor by tuning the variable resistor,
   wherein the first transistor and the second transistor are metal oxide semiconductor (MOS) transistors, and the second transistor has a drain connected to the variable resistor and a gate of the first transistor.

2. The varactor device as claimed in claim 1, wherein the capacitor set having at least one parallel capacitor.

3. The varactor device as claimed in claim 1, wherein the second transistor has a gate connected to a source of the first transistor.

4. The varactor device as claimed in claim 1, further comprising a resistance device connected in series to the capacitor set and the first transistor.

5. The varactor device as claimed in claim 4, wherein the resistance device is a resistor.

6. The varactor device as claimed in claim 4, wherein the resistance device is a voltage controlled resistor.

7. The varactor device as claimed in claim 1, further comprising a first current source and a second current source respectively connected in series to the first and the second transistors for providing a bias current to the first transistor and the second transistor.

8. The varactor device as claimed in claim 1, wherein the variable resistor is a voltage controlled resistor.

9. A differential varactor device, comprising:
   a first capacitance circuit, which has a first capacitor set and a first transistor connected across the first capacitor set;
   a variable resistor;
   a second transistor, which is coupled to the first transistor and connected in series to the variable resistor, for feeding an output signal generated by applying voltage to the first capacitance circuit back to the first transistor;
   a second capacitance circuit, which has a second capacitor set and a third transistor connected across the second capacitor set; and
   a fourth transistor, which is coupled to the third transistor and connected in series to the variable resistor for feeding an output signal generated by applying voltage to the second capacitance circuit back to the third transistor, thereby controlling gains of the first and the third transistors by tuning the variable resistor.

10. The differential varactor device as claimed in claim 9, wherein the first and the second capacitor sets are composed of at least one parallel capacitor respectively.

11. The differential varactor device as claimed in claim 9, wherein the first, the second, the third and the fourth transistors are metal oxide semiconductor (MOS) transistors.

12. The differential varactor device as claimed in claim 11, wherein the second transistor has a drain connected to the variable resistor and the gate of the first transistor, and the fourth transistor has a drain connected to the variable resistor and the gate of the third transistor.

13. The differential varactor device as claimed in claim 12, wherein the second transistor has a gate connected to a source of the first transistor, and the fourth transistor has a gate connected to a source of the third transistor.

14. The differential varactor device as claimed in claim 9, further comprising a resistance device connected between the first and the third transistors.

15. The differential varactor device as claimed in claim 14, wherein the resistance device is a resistor.

16. The differential varactor device as claimed in claim 14, wherein the resistance device is a voltage controlled resistor.

17. The differential varactor device as claimed in claim 9, further comprising a first current source, a second current source, a third current source and a fourth current source respectively connected in series to the first, the second, the third and the fourth transistors for providing a bias current to the first, the second, the third and the fourth transistors.

18. The differential varactor device as claimed in claim 9, wherein the variable resistor is a voltage controlled resistor.

19. A varactor device, comprising:
 a capacitance circuit, which has a capacitor set and a first transistor connected across the capacitor set;
 a variable resistor;
 a second transistor, which is coupled to the first transistor and connected in series to the variable resistor, for feeding an output signal generated by applying voltage to the capacitance circuit back to the first transistor, thereby controlling a gain of the first transistor by tuning the variable resistor; and
 a first current source and a second current source respectively connected in series to the first and the second transistors for providing a bias current to the first transistor and the second transistor.

20. The varactor device as claimed in claim 19, wherein the capacitor set having at least one parallel capacitor.

21. The varactor device as claimed in claim 19, wherein the first transistor and the second transistor are metal oxide semiconductor (MOS) transistors.

22. The varactor device as claimed in claim 21, wherein the second transistor has a drain connected to the variable resistor and a gate of the first transistor.

23. The varactor device as claimed in claim 22, wherein the second transistor has a gate connected to a source of the first transistor.

24. The varactor device as claimed in claim 19, further comprising a resistance device connected in series to the capacitor set and the first transistor.

25. The varactor device as claimed in claim 24, wherein the resistance device is a resistor.

26. The varactor device as claimed in claim 24, wherein the resistance device is a voltage controlled resistor.

27. The varactor device as claimed in claim 19, wherein the variable resistor is a voltage controlled resistor.

* * * * *